United States Patent [19]

Ozawa et al.

[11] Patent Number: 5,172,304
[45] Date of Patent: Dec. 15, 1992

[54] CAPACITOR-CONTAINING WIRING BOARD AND METHOD OF MANUFACTURING THE SAME

[75] Inventors: Jyuichiro Ozawa; Kikuo Wakino, both of Kyoto, Japan

[73] Assignee: Murata Manufacturing Co., Ltd., Japan

[21] Appl. No.: 795,713

[22] Filed: Nov. 21, 1991

[30] Foreign Application Priority Data

Nov. 22, 1990 [JP] Japan .................................. 2-320341
Oct. 1, 1991 [JP] Japan .................................. 3-282324

[51] Int. Cl.$^5$ ............................ H01B 5/00; H05K 1/18
[52] U.S. Cl. .................................... 361/401; 174/72 B
[58] Field of Search ............... 361/321, 401; 174/72 B

[56] References Cited

U.S. PATENT DOCUMENTS

| | | | |
|---|---|---|---|
| 4,382,156 | 5/1983 | Jodoin | 174/72 B |
| 4,636,908 | 1/1987 | Yoshihara et al. | 361/321 |
| 4,862,323 | 8/1989 | Butt | 361/388 |
| 4,882,651 | 11/1989 | Maher | 361/321 |
| 4,996,097 | 2/1991 | Fischer | 428/220 |
| 5,038,132 | 8/1991 | Lindblom et al. | 338/307 |

Primary Examiner—Donald Griffin
Attorney, Agent, or Firm—Ostrolenk, Faber, Gerb & Soffen

[57] ABSTRACT

A flat capacitor-containing wiring board, which can be arranged optionally in the interior of a multilayer substrate. This capacitor-containing wiring board has a dielectric substrate which is made of a mixture of dielectric powder and resin, and conductors which are provided on both major surfaces of the dielectric substrate. The conductors can be etched and shaped so as to form capacitors which use the interior of the wiring board as their dielectric layers. With this wiring board, it is possible to etch the conductors so that the values of the capacitors can be freely selected over a wide range, the wiring board is flexible to some extent, and no pinholes or defects are defined over a wide area. Preferably, the board has a greater relative resin content near its surfaces than in its interior, which improves the dielectric characteristics of the board. The increased resin content may be provided by resin adhesive layers on the surfaces which permeate the board to some extent.

19 Claims, 3 Drawing Sheets

CAPACITOR-CONTAINING WIRING BOARD AND METHOD OF MANUFACTURING THE SAME

BACKGROUND OF THE INVENTION

1. Field of the Invention

The present invention relates to a capacitor-containing wiring board, which can be freely provided with a capacitor its interior, i.e., a capacitor which employs the wiring board as its dielectric layer, and a method of manufacturing the same.

2. Description of the Background Art

Chip-type capacitors are conventionally employed for electronic circuits.

However, such a capacitor requires a number of steps for mounting, soldering and the like, and has inferior reliability due to an extremely thin dielectric member employed therein. When it is to be applied to a multi-layer substrate, further, such a capacitor can only be mounted on the uppermost layer.

In place of such a conventional capacitor, therefore, there is a need for a flat capacitor-containing wiring board, which can be arranged also in the interior of a multilayer substrate, having the advantages that it is possible to etch conductors provided on both surfaces thereof, the value of capacitors can be freely selected in a wide range, the board is flexible to some extent, and no pinholes nor defects are defined over a wide area.

SUMMARY OF THE INVENTION

Accordingly, the principal object of the present invention is to provide a capacitor-containing wiring board which can satisfy the aforementioned requirements, and a method of manufacturing the same.

Briefly stated, the inventive capacitor-containing wiring board comprises a dielectric substrate which is made of a mixture of dielectric powder and resin, and conductors which are respectively provided on both major surfaces of the dielectric substrate to be at least partially opposite to each other. The conductors may be formed by copper foil members or copper thin films.

In such a capacitor-containing wiring board, the conductors provided on both sides thereof can be freely etched to arbitrarily form capacitors which use the interior of the board as their dielectric layer. Further, the inventive capacitor-containing wiring board is flexible to some extent, and has no pinholes nor defects over a wide range. Therefore, the user of such a capacitor-containing wiring board can form capacitors in any arbitrary value, number, mode of connection and the like unlike the conventional capacitor. Further, the inventive wiring board can be freely arranged in any position, whereby the degree of freedom in electronic circuit design is remarkably improved.

A resistor thin film may be interposed between the dielectric substrate and at least one of the conductors provided on the major surfaces thereof. In this case, further advantages are attained in relation to the resistors thus formed, in that steps of mounting, soldering and the like can be omitted, reliability is improved due to reduction of soldering, the resistors can be arranged in arbitrary positions, and the distances of interconnection between the resistors and capacitors etc. can be minimized to improve high-frequency characteristics, in addition to the aforementioned advantages regarding the capacitors, whereby the degree of freedom in electronic circuit design is further remarkably improved.

The concentration of the resin contained in the dielectric substrate may be minimized at the central portion of the substrate and increased toward the major surfaces. In this case, the concentration of the resin can be reduced so as to increase the concentration of the dielectric powder in the substrate as compared with a substrate containing homogeneously diffused resin, to attain a high dielectric constant as the result. Further, it is possible to improve the adhesion of copper foil members with respect to the dielectric substrate, since the concentration of the resin is at its maximum at the major surfaces, to which the copper foil members are pasted.

The method according to the present invention comprises the steps of molding dielectric powder or a mixture of dielectric powder and resin into a plate in a vacuum for forming a dielectric substrate, placing copper foil members on both major surfaces of the dielectric substrate through adhesives of resin, and integrating these materials with each other by simultaneously pressurizing and heating the same. The adhesives may be replaced by resin films. According to this method, the adhesives are melted by pressurization and heating to permeate the dielectric substrate from the major surfaces, whereby the concentration of the resin contained in the dielectric substrate can be minimized at the central portion and increased toward the major surfaces. Thus, it is possible to obtain a capacitor-containing wiring board whose dielectric substrate has a high dielectric constant with excellent adhesion of the copper foil members. This also applies to the case where resin films are employed in place of the adhesives.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
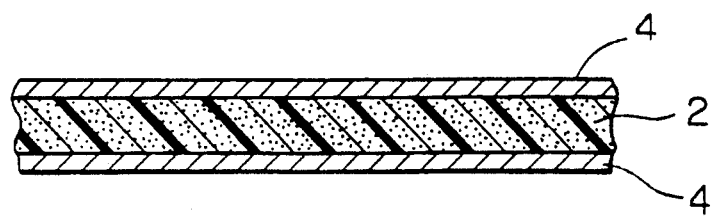
FIG. 1 is a sectional view partially showing a capacitor-containing wiring board according to a first embodiment of the present invention.

Referring to FIG. 1, a capacitor-containing wiring board according to an embodiment of the present invention comprises a dielectric substrate 2, which is made of a mixture of dielectric powder and resin, and conductors 4, which are provided on both major surfaces of the dielectric substrate 2.

The dielectric substrate 2 is formed by molding a mixture of dielectric powder and a resin solution into a plate such as a ceramic green sheet having a constant thickness with high accuracy and drying the same, for example. No glass fiber is contained in this dielectric substrate 2.

The dielectric powder is prepared by pulverizing a fired dielectric ceramic material such as barium titanate or titanium oxide or a dielectric substance such as mica into fine powder, for example. The resin is prepared from epoxy resin, bismaleimidetriazine, polyimide or the like, for example.

The conductors 4 may be formed by pasting copper foil members onto both major surfaces of the aforementioned dielectric substrate 2 by thermocompression bonding or with adhesives, by pasting a copper foil member to one major surface of the aforementioned dielectric substrate 2 in the aforementioned manner while depositing a copper thin film onto the other major surface by PVD (physical vapor deposition) such as sputtering or vacuum deposition, CVD (chemical vapor deposition) or plating, or by depositing copper thin films onto both major surfaces of the aforementioned dielectric substrate 2 by PVD, CVD or plating.

When the conductors 4 are formed of copper thin films, the same may be deposited on the dielectric substrate 2 which is still in a semi-hardened state, in order to improve adhesion therebetween. When the dielectric substrate 2 is employed in a hardened state, on the other hand, the copper thin films may be formed by acceleration of ions with a dc voltage in a PVD or CVD process.

Figure 2:
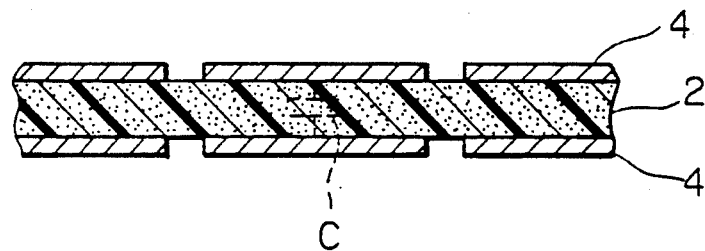
FIG. 2 is a sectional view partially showing an exemplary usage of the capacitor-containing wiring board shown in FIG. 1.

In the aforementioned capacitor-containing wiring board, the conductors 4 can be freely etched for arbitrarily forming capacitors in any arbitrary number, arrangement, mode of connection, value and the like. FIG. 2 shows an exemplary capacitor-containing wiring board, which provides a desired capacitance C in its central portion.

It has been proposed to stock a conductor layer, a dielectric layer and another conductor layer in this order on an insulating base material. In this structure, however, it is difficult to etch the lower conductor layer through the dielectric layer, and only the upper conductor layer can be etched in general. Therefore, the lower conductor layer serves as a common electrode for a plurality of capacitors, and hence signal leakage is caused due to high stray capacitance between the capacitors, and no degree of freedom is attained in interconnection. Thus, such a structure cannot be put into practice.

Figure 3:
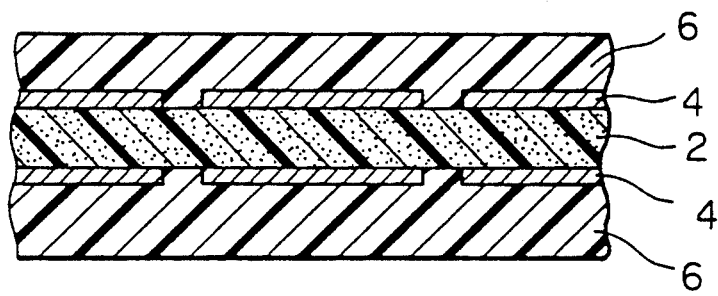
FIG. 3 is a sectional view partially showing another exemplary usage of the capacitor-containing wiring board shown in FIG. 1.

Referring now to FIG. 3, for example, a solution to the just-mentioned problem is described. In the structure of FIG. 3, the aforementioned capacitor-containing wiring board may be held between other substrates 6 after the conductors 4 are appropriately etched so that the same can be arranged in the interior of a multilayer substrate, or pasted onto the surface of another printed board.

It is possible to freely change the surface areas of the regions of the conductors 4 which serve as the capacitor electrodes, the thickness of the dielectric substrate 2, the material and the concentration of the dielectric powder contained in the dielectric substrate 2, and the like. Thus, the value of the capacitors obtained can be freely selected to cover a wide range.

Further, the dielectric substrate 2 is flexible to some extent due to the resin contained therein. Thus, no cracking occurs even if the same is combined with another flexible substrate or the like.

In general, a dielectric member tends to experience pinholes etc. if it is too thin. In the inventive capacitor-containing wiring board, however, it is possible to attain a desired capacitance either by increasing the surface areas of the regions of the conductors 4 which serve as the capacitor electrodes, or by increasing the dielectric constant by changing the dielectric powder contained therein, without excessively reducing the thickness of the dielectric substrate 2. Further, the dielectric substrate 2 contains resin. Thus, it is possible to obtain a highly reliable wiring board which has no pinholes nor defects over a wide area.

With such a capacitor-containing wiring board, therefore, the user can freely form capacitors using the interior of the board as their dielectric, in an arbitrary value, number, mode of connection and the like, and the wiring board can be freely arranged in any position. Thus, the degree of freedom in electronic circuit design is remarkably improved.

Figure 4:
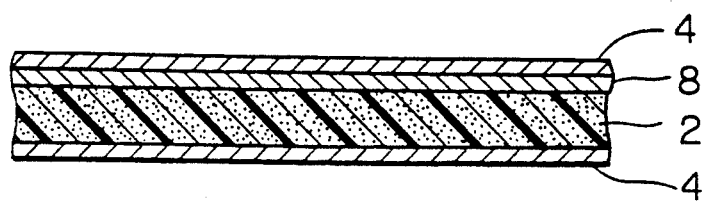
FIG. 4 is a sectional view partially showing a capacitor-containing wiring board according to a second embodiment of the present invention.

FIG. 4 shows a capacitor-containing wiring board according to a second embodiment of the present invention, which comprises a dielectric substrate 2, conductors 4 and a resistor thin film 8 interposed between the dielectric substrate 2 and one or both of the conductors 4. In this case, the capacitor-containing wiring board can also contain resistors in addition to capacitors.

With such a capacitor-containing wiring board which also contains a resistor layer, it is possible to attain various advantages related in relation the resistors, in that no steps of mounting, soldering and the like are required, unlike with conventional resistors, reliability is improved due to reduction in the number of soldering steps, the resistors can be freely arranged in arbitrary positions, and the distances of interconnection between the resistors and the capacitors etc. can be minimized to improve high-frequency characteristics, in addition to the aforementioned advantages regarding the capacitors.

The resistor thin film 8 is made of a nickel-chromium alloy, chromium silicon, tantalum nitride, ITO (indium oxide doped with tin) or the like, for example. This resistor thin film 8 is about 0.1 $\mu$m in thickness, for example, but its thickness is not restricted to this.

The resistor thin film 8 can also be deposited onto the dielectric substrate 2 by the aforementioned PVD or CVD process. The conductors 4 are provided thereon in a similar manner to the above.

The resistor thin film 8 may be deposited onto the dielectric substrate 2 which is still in a semi-hardened state, in order to further improve adhesion therebetween. When the dielectric substrate 2 is in a hardened state, on the other hand, it is possible to deposit the resistor thin film 8 thereto with acceleration of ions with a dc voltage.

Figure 5:
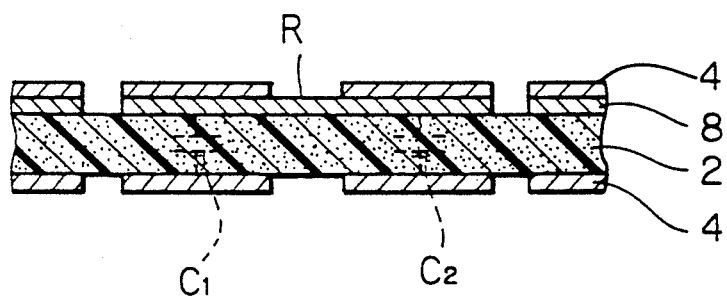
FIG. 5 is a sectional view partially showing an exemplary usage of the capacitor-containing wiring board shown in FIG. 4.

In such a capacitor-containing wiring board, it is possible to freely form capacitors and resistors by appropriately etching the conductors 4 and the resistor thin film 8 in this order. FIG. 5 shows an exemplary state of such a wiring board, which is provided with a series circuit of two capacitors $C_1$ and $C_2$ and a resistor R.

When the inventive wiring board has the resistor thin film 8, the conductor 4 provided thereon is preferably formed of a copper thin film having a small thickness, so that the accuracy of etching the conductor 4 is improved in response to its thickness. Thus, it is possible to improve the accuracy of the resistance of the resistors contained in the wiring board.

When the conductor 4 provided on the resistor thin film 8 is formed of a copper thin film, a diffusion preventing film (not shown) may be interposed between these films in order to prevent the copper thin film from diffusion of materials contained in the resistor thin film 8, such as nickel and chromium when the film 8 is made of a nickel-chromium alloy, so that the resistor thin film 8 is improved in stability and prevented from time change of the resistance. This diffusion-preventing film is made of nickel, molybdenum, titanium or the like, for example.

Figure 6:
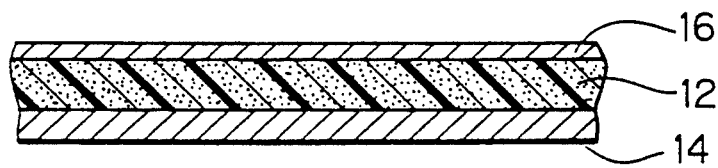
FIG. 6 is a sectional view partially showing a capacitor-containing wiring board according to a third embodiment of the present invention.

FIG. 6 is a sectional view partially showing a capacitor-containing wiring board according to a third embodiment of the present invention.

In this capacitor-containing wiring board, the aforementioned dielectric substrate 2 is replaced by a dielectric layer 12 made of a mixture of dielectric powder and resin, which is provided on one major surface with a copper foil member 14 an adhesion step or the like, and on the other major surface a copper thin film 16 is deposited thereon by PVD, CVD or the like.

Also in this embodiment, a resistor thin film and/or a diffusion-preventing film may be provided between the dielectric layer 12 and the copper foil member 14 and/or the copper thin film 16, if necessary. Further, the copper thin film 16 may be replaced by a second copper foil member, which is pasted onto the dielectric layer 12.

It is conceivable to replace the aforementioned dielectric substrate 2, which is made of a mixture of dielectric powder and resin, by a substrate made of glass fiber which is impregnated with a mixture of dielectric powder and resin. Through an experiment, however, it has been proved that such a material is unpreferable.

With such a dielectric substrate containing glass fiber, it would seem possible to improve the dielectric constant by increasing the concentration of the dielectric powder contained therein. However, such improvement was hardly attained in practice. When dielectric powder was prepared from ceramic powder having a dielectric constant of about 2000 and the ratio of the ceramic powder to epoxy resin was changed as 0/100, 23/77 and 55/45 in volume percentage, the dielectric constant was only slightly increased to about 5, about 7 and about 8 respectively. When a dielectric substrate was prepared from a material containing ceramics and epoxy resin in a ratio of 55/45 with no glass fiber, on the other hand, the dielectric constant was considerably increased to about 29. Thus, it has been recognized that the dielectric constant of a substrate containing glass fiber cannot be effectively improved even if the content of the dielectric powder is increased.

In order to attain a higher dielectric constant in such a dielectric substrate containing no glass fiber, the content of dielectric powder was further increased so that the ratio of this dielectric powder to resin was 70/30. In this case, however, adhesion of a copper foil member to the dielectric substrate was so deteriorated that the copper foil member slightly lifted from the dielectric substrate so as to disable measurement of the dielectric constant. Thus, it has been recognized inadvisable to excessively increase the concentration of the dielectric powder.

Figure 7:
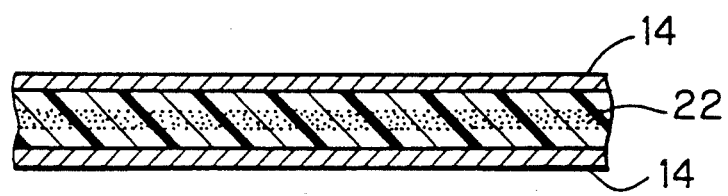
FIG. 7 is a sectional view partially showing a capacitor-containing wiring board according to a fourth embodiment of the present invention.

Further study was made on this point, and it was recognized that a higher dielectric constant can be attained by increasing the concentration of the dielectric powder contained in the dielectric substrate while improving adhesion of the copper foil member to the dielectric substrate in the following manner:

FIG. 7 shows a capacitor-containing wiring board according to a fourth embodiment of the present invention, which comprises a dielectric substrate 22 made of a mixture of dielectric powder and resin. The concentration of the resin contained in this dielectric substrate 22 is minimized at the central portion and is increased toward both major surfaces. This dielectric substrate 22 contains no glass fiber, as a matter of course. Copper foil members 14 are pasted onto the major surfaces of the dielectric substrate 22.

With such a capacitor-containing wiring board, it is possible to reduce the concentration of the resin contained in the dielectric substrate 22 as a whole, as compared with a substrate containing homogeneously diffused resin. In other words, the concentration of the dielectric powder can be increased, thereby attaining a higher dielectric constant in the dielectric substrate 22. Further, the concentration of the resin is increased toward the major surfaces of the dielectric substrate 22, which are in contact with the copper foil members 14, whereby the copper foil members 14 are improved in adhesion with respect to the dielectric substrate 22. As described later with reference to the method according to the present invention, it is possible to increase the dielectric constant of the dielectric substrate 22 to a value of at least twice that of a substrate containing homogeneously diffused resin with the same materials and dimensions, without deteriorating adhesion of the copper foil members.

Figure 8:
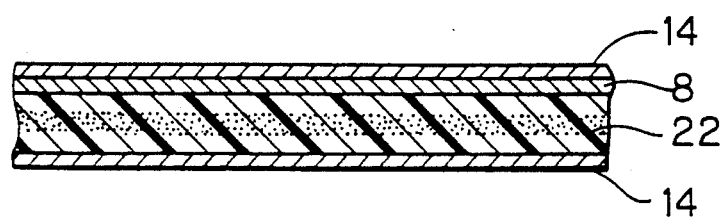
FIG. 8 is a sectional view partially showing a capacitor-containing wiring board according to a fifth embodiment of the present invention.

FIG. 8 shows a capacitor-containing wiring board according to a further embodiment of the present invention, which comprises a dielectric substrate 22 of the aforementioned type, copper foil members 14, and a resistor thin film 8 interposed between the dielectric substrate 22 and one or both of the copper foil members 14. This capacitor-containing wiring board can also contain resistors in addition to capacitors.

Figure 9:
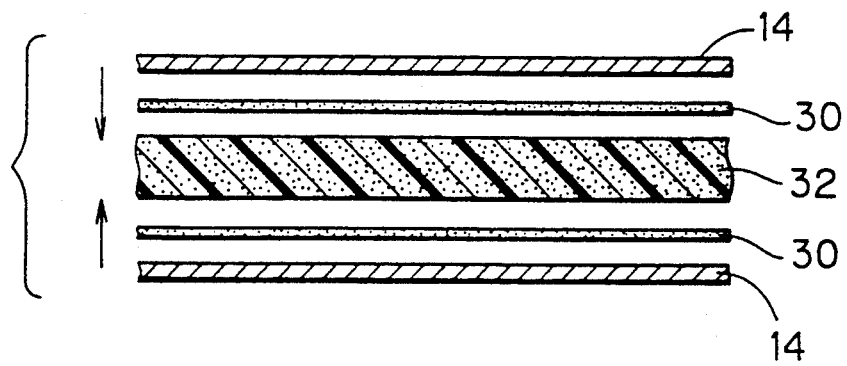
FIG. 9 is a diagram for illustrating an exemplary method of manufacturing a capacitor-containing wiring board according to the present invention.

A method of manufacturing the capacitor-containing wiring board shown in FIG. 7 or 8 is now described with reference to FIG. 9.

First, dielectric powder or a mixture of such dielectric powder and resin is molded into a plate in a vacuum, to form a dielectric substrate 32. The dielectric powder and the resin are prepared from the aforementioned materials. The resin, which is adapted to increase the strength of the as-formed dielectric substrate 32, may be contained in a small amount of not more than 15 percent by weight, for example. The material is molded in a vacuum so that no bubbles are left in the interior of the as-formed dielectric substrate 32 to reduce the dielectric constant.

Then, copper foil members 14 are placed on both major surfaces of the dielectric substrate 32 with adhesives 30 of resin, and these materials are integrated with each other by simultaneous pressurization and heating. The adhesives 30, which are prepared from epoxy resin, polyimide resin or the like, may be previously applied onto either the major surfaces of the dielectric substrate 32 or the surfaces of the copper foil members 14 facing the dielectric substrate 32. While the materials are preferably pressurized and heated in a vacuum in order to enable voidless and low-pressure molding, this step may alternatively be carried out in the atmosphere.

According to this method, the adhesives 30 are melted in the pressurization and heating step so as to permeate clearances, which are microscopically defined in the dielectric substrate 32, through the major surfaces of the substrate 32. Therefore, the concentration of the resin contained in the dielectric substrate 32 can be minimized at the central portion and increased toward the major surfaces up to approximately 100%, for example. Thus, it is possible to obtain a capacitor-containing wiring board which comprises a dielectric substrate having a high dielectric constant and copper foil members having high adhesion, as described above with reference to FIG. 7.

As to an Example of the aforementioned method, dielectric powder, which was prepared from a mixture containing 85 percent by weight of barium titanate and 15 percent by weight of epoxy resin with a dielectric constant of about 2000, was molded into a plate in a vacuum, to obtain a dielectric substrate 0.2 mm in thickness. Copper foil members, which were coated with epoxy-based adhesives about 10 μm in thickness, were pasted onto both surfaces of the dielectric substrate. Then, these materials were pressurized and heated to form a capacitor-containing wiring substrate. In the as-formed capacitor-containing wiring board, the dielectric substrate exhibited a dielectric constant of about 62, and adhesion of the copper foil members was moderate in practice. The concentration of the dielectric powder contained in the dielectric substrate was about 75 percent by weight, including melted material now the adhesives. As hereinabove described, it has been impossible until now to attain such a high concentration of the dielectric powder in a wiring board containing homogeneously diffused resin, in view of adhesion of the copper foil members.

In place of the aforementioned adhesives 30, resin films may be placed on the dielectric substrate 32 and then subjected to pressurization and heating. Also in this case, the resin films are melted and permeate the dielectric substrate 32, thereby attaining an effect similar to that of the adhesives 30. Such resin films may be formed by epoxy resin films, polyimide films or the like, for example. The resin films are preferably not more than 50 μm in thickness, for example, since the dielectric constant is reduced due to the increase of residual contents on the surfaces of the dielectric substrate 32 if the same are too thick.

In either case, with the adhesives or the resin films, a resistor thin film may be formed on a surface, which faces the dielectric substrate 32, of one or each copper foil member 14, to obtain a capacitor-containing wiring substrate containing resistors in addition to capacitors. Such a resistor thin film is prepared from the aforementioned material.

As to another Example of the inventive capacitor-containing wiring board, it has been made possible to increase the dielectric constant of a dielectric substrate by employing high molecular epoxy resin whose molecular weight is at least 5000 for increasing the amount of dielectric powder, although the molecular weight of epoxy resin which is generally employed for a substrate is not more than 2500 at the most. In general, the dielectric constant is hardly influenced by the molecular weight of the epoxy resin. When epoxy resin of at least 5000 in molecular weight is employed, however, wettability with respect to the dielectric powder is increased due to its long straight chain macromolecules, thereby improving dispersibility of the powder. This is conceivably because the surfaces of the highly dispersed particles of the dielectric powder are covered with hardenable thin layers of resin even if the amount of epoxy resin is reduced, and hence the substrate is provided with practically moderate strength as a composite material while interference with the adhesion of the copper foil members is reduced. The result of an experiment is now described.

High molecular epoxy resin was prepared from epoxy resin about 5700 in molecular weight, such as Epikote 1009 (trade name) made by Yuka Shell Epoxy Kabushiki Kaisha, for example. An admixture containing 20 percent by weight of a resin material including a hardening agent and a hardening accelerator and 80 percent by weight of dielectric powder which was prepared from barium titanate having a dielectric constant of about 2000 was sufficiently melted and kneaded, and thereafter pulverized. The as-formed powder was held between two copper foil members, and subjected to heating and pressure molding in a vacuum, to form a double-coppered capacitor-containing wiring substrate 0.3 mm in thickness. The as-formed substrate exhibited a dielectric constant of 120, while adhesion with copper foil members was moderate in practice.

Although the present invention has been described and illustrated in detail, it is clearly understood that the same is by way of illustration and example only and is not to be taken by way of limitation, the scope of the present invention being limited only by the terms of the appended claims.

What is claim is:

1. A capacitor-containing wiring board comprising:
   a dielectric substrate with two major surfaces and made of a mixture of dielectric powder and resin; and
   first and second conductors provided respectively on both major surfaces of said dielectric substrate so as to be at least partially opposite to each other;
   further comprising a resistor thin film interposed between said dielectric substrate and at least one of said first and second conductors;
   wherein said resistor thin film and said first and second conductors have means forming a series connection of two capacitors interconnected by a resistor.

2. A capacitor-containing wiring board in accordance with claim 1, wherein said first and second conductors include copper foil members.

3. A capacitor-containing wiring board in accordance with claim 1, wherein said first conductor includes a copper foil member and said second conductor includes a copper thin film.

4. A capacitor-containing wiring board in accordance with claim 1, wherein said first and second conductors include copper thin films.

5. A capacitor-containing wiring board in accordance with claim 1, wherein said first and second conductors are selected from the group consisting of copper foil members and copper thin films.

6. A capacitor-containing wiring board in accordance with claim 1, wherein a central portion of said substrate has a greater relative content of said dielectric powder than a portion near said major surfaces.

7. A capacitor-containing wiring board in accordance with claim 6, further comprising respective resin adhesive layers between said first and second conductors and said dielectric substrate.

8. A capacitor-containing wiring board in accordance with claim 1, further comprising respective resin adhesive layers between said first and second conductors and said dielectric substrate.

9. A capacitor-containing wiring board in accordance with claim 1, further comprising respective resin adhesive layers between said first and second conductors and said dielectric substrate.

10. A capacitor-containing wiring board in accordance with claim 1, further comprising respective resin adhesive layers between said first and second conductors and said dielectric substrate.

11. A capacitor-containing wiring board in accordance with claim 1, further comprising a pair of outer substrates respectively adhered to said first and second conductors.

12. A method of manufacturing a capacitor-containing wiring board, comprising the steps of:
forming a dielectric substrate by molding dielectric powder or a mixture of dielectric powder and resin into a plate in a vacuum;
adhering copper foil members on both major surfaces of said dielectric substrate with resin adhesive layers; and
integrating said materials with each other by simultaneously pressurizing and heating the same;
wherein a central potion of said substrate has a greater relative content of said dielectric powder than a portion near said major surface; and
wherein the relative resin concentration in said substrate near said major surfaces is approximately 100%.

13. A method of manufacturing a capacitor-containing wiring board in accordance with claim 12, further comprising a step of pasting a resistor film onto a surface, facing said dielectric substrate, of at least one of said copper foil members.

14. A capacitor-containing wiring board in accordance with claim 12, wherein said resin layers are not more than about 50 μm thickness.

15. A method of manufacturing a capacitor-containing wiring board, comprising the steps of:
forming a dielectric substrate by molding dielectric powder or a mixture of dielectric powder and resin into a plate in a vacuum;
locating a first copper member, said dielectric substrate, and a second copper member in this order; and
integrating said materials with each other by simultaneously pressurizing and heating the same; and
further comprising the step of locating first and second resin films respectively between said first and second copper members and said substrate before said integrating step.

16. A method of manufacturing a capacitor-containing wiring board in accordance with claim 15, further comprising a step of pasting a resistor thin film onto a surface, facing said dielectric substrate, of at least one of said copper foil members.

17. A method in accordance with claim 15, wherein said copper members are selected from the group consisting of copper foil members and copper thin films.

18. A method in accordance with claim 15, wherein said substrate has a greater relative dielectric powder content in its interior than near its first and second major surfaces.

19. A method of manufacturing a capacitor-containing wiring board, comprising the steps of:
forming a dielectric substrate by molding dielectric powder or a mixture of dielectric powder and resin into a plate in a vacuum;
locating a first copper member, said dielectric substrate, and a second copper member in this order; and
integrating said materials with each other by simultaneously pressurizing and heating the same;
wherein said substrate has a greater relative dielectric powder content in its interior than near its first and second major surfaces; and
further comprising the step of locating first and second resin films respectively between said first and second copper members and said substrate before said integrating step so as to increase the relative content of said resin near said first and second major surfaces.

* * * * *